United States Patent [19]
Bialo

[11] Patent Number: 4,719,374
[45] Date of Patent: Jan. 12, 1988

[54] BROADBAND ELECTRIC FIELD CONTROLLED SWITCHING CIRCUIT

[75] Inventor: Charles A. Bialo, San Jose, Calif.

[73] Assignee: Ampex Corporation, Redwood City, Calif.

[21] Appl. No.: 851,035

[22] Filed: Apr. 11, 1986

[51] Int. Cl.$^4$ .............. H03K 17/687; H03K 3/33; H03K 17/56; H01P 1/10
[52] U.S. Cl. ................. 307/571; 307/242; 307/317 R; 333/104
[58] Field of Search .......... 307/571, 572, 279, 317 R, 307/242; 333/103, 104, 262

[56] References Cited

U.S. PATENT DOCUMENTS 3,532,899 10/1970 Huth et al. ........................ 307/572
3,586,880 6/1971 Fitzwater, Jr. .................... 307/572
4,029,973 6/1977 Kobayashi et al. ............... 307/279
4,158,149 6/1979 Otofuji .............................. 307/571

Primary Examiner—Stanely D. Miller
Assistant Examiner—B. P. Davis
Attorney, Agent, or Firm—Elizabeth E. Strnad; Richard P. Lange

[57] ABSTRACT

A broadband switching circuit has two or more field controlled switch elements coupled in series between an input terminal and an output terminal. A passive, lossy network is coupled between a junction of consecutive switch elements and a virtual around. The off state isolation of the switch elements is improved and signal losses are reduced significantly. When utilized in multi-channel switching circuits, only a single switching voltage polarity per channel is required.

32 Claims, 4 Drawing Figures

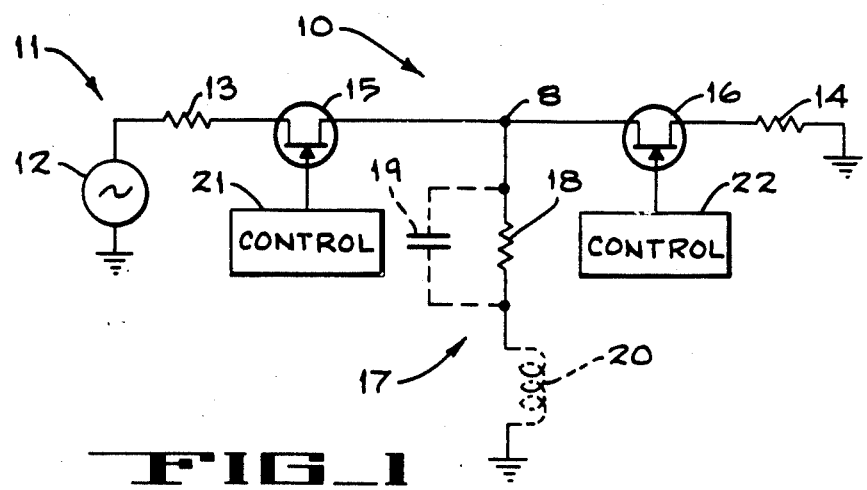
FIG_1
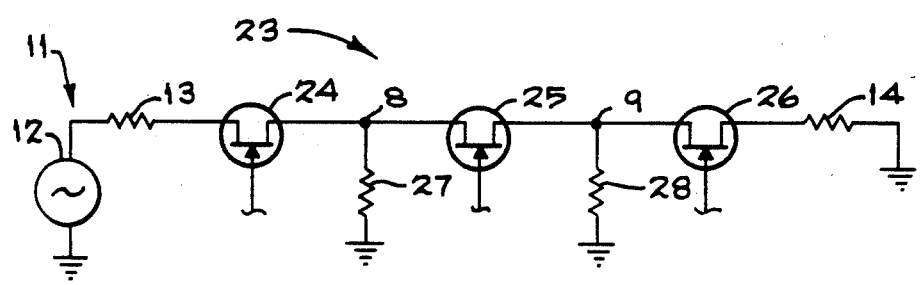
FIG_2
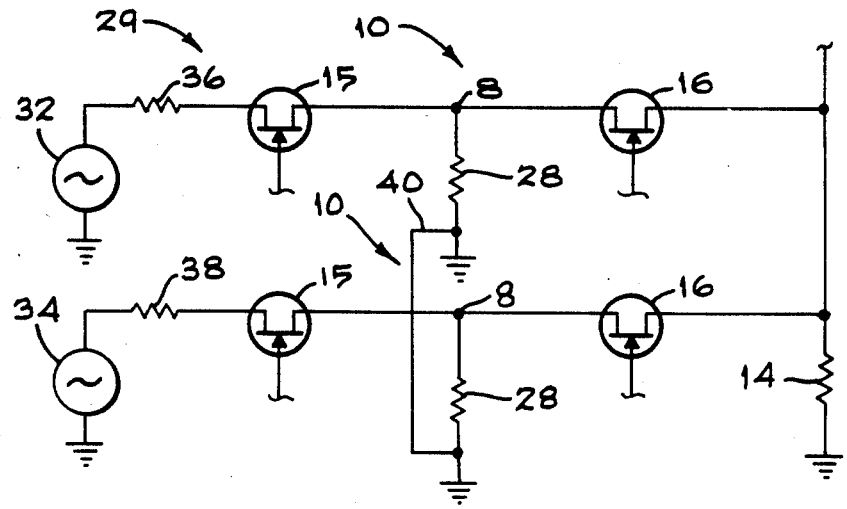
FIG_3

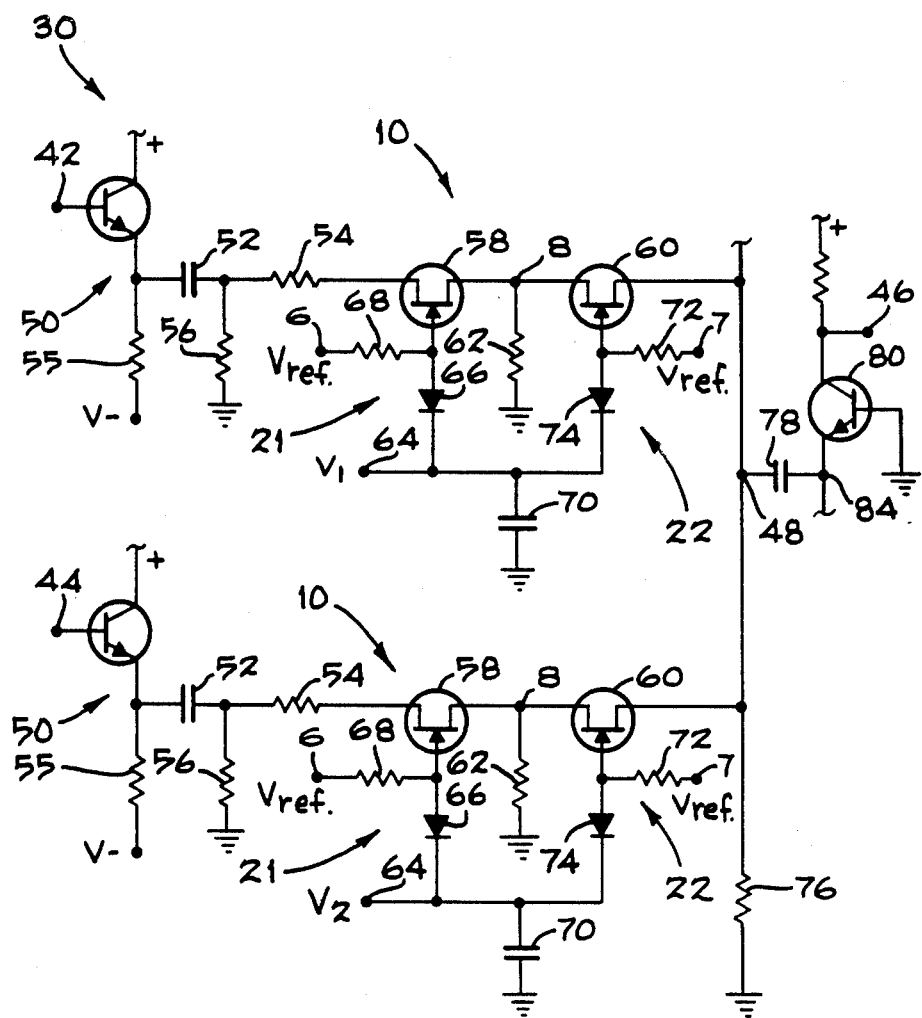
FIG_4

BROADBAND ELECTRIC FIELD CONTROLLED SWITCHING CIRCUIT

BACKGROUND OF THE INVENTION

This invention relates to a broadbrand electric field controlled switching circuit and in particular, to such circuit having two or more electric field controlled switch elements coupled in series between an input and an output of the circuit.

Electric field controlled switching elements, such as field effect transistors (FET's) are generally utilized in switching applications where a desired high on/off resistance ratio and zero DC offset is required. The major factor which limits the use of FET switch elements in broadband applications is the trade-off required between obtaining low values of feedthrough impedance Rds(on) between the drain and source when the switch is in the on mode and obtaining high values of feedthrough impedance in the off mode. The major contributors to the value of off mode impedance are parasitic capacitances primarily between the drain and gate (Cdg) and between the source and gate (Csg) which affect signal feedthrough and bypass in the off mode. There also is a small parasitic capacitance between the drain and source (Cds).

Current art favors the use of FET's with low parasitic capacitances and high Rds(on) (above 50 ohms). These FET's can be used to pass a broadband signal when used as a series switch between a low impedance signal source and a low impedance load (less than 100 ohms). However, the signal losses in Rds(on) compromise switch performance as the series Rds(on) results in the loss of a large portion of the signal. Also this loss varies with Rds(on) which value in turn varies over a wide range with commercial FET's. Because of this signal loss, additional amplification circuitry and an individual gain calibration control may be required.

As the frequency of the transmitted signal increases, feedthrough impedance in off mode decreases, thus making a single FET incapable of providing sufficient isolation between the input and output. Multiple FET's can then be arranged in networks which generally are referred to by names suggestive of the shape of the interconnecting active elements. These networks conventionally include an "L" section where a parallel or shunt-to-ground FET is added before or after the basic series off/on FET and controlled in opposite on/off conductance manner. Another conventional configuration is to have a "T" network which includes two series FET switches and a shunt FET switch connected between the two interconnected switches and ground. The shunt FET conventionally provides a low impedance bypass when the series switches are in an off mode. However, at higher frequencies, the parasitic capacitances in this shunt circuit provide increasingly lower impedances when the series FET's are in an on mode, thereby increasing the signal loss in the circuit. While at low frequencies these networks offer satisfactory performance, in broadband applications extending into the VHF region, performance becomes marginal due to previously described signal losses and gain variation inherent to all FET's in the circuit.

In multichannel applications utilizing two or more parallel signal channels, for example in a signal multiplexer or demultiplexer, where each channel has conventional series FET switches and FET shunt elements, two control voltages are required for each channel. That is, when the series switches are on, the shunt switch or switches must be off, and vice versa. It is therefore desirable to provide switch control using a single control voltage polarity per channel.

SUMMARY OF THE INVENTION

The present invention utilizes series electric field controlled switches having improved isolation in off state at high frequencies and yet having reduced loss and gain variation as a function of frequency. The invention also provides a switch control having improved high-frequency bypassing when in off state. When utilized in multichannel switching applications, switch control is simplified by requiring only a single control voltage polarity per channel.

More specifically, the circuit of the present invention has two or more series connected, electric field controlled switches. The respective junctions between these switches are coupled to a virtual ground through a lossy, passive shunt element. In the preferred embodiment the invention contemplates a switch control network which provides an improved feedthrough bypass when in the off mode.

These and other features and advantages of the present invention will become more clearly understood from a consideration of the drawings and the following detailed description of the preferred embodiment.

BRIEF DESCRIPTION OF THE DRAWINGS

FIG. 1 is a simplified circuit diagram of a switching circuit in accordance with the present invention;

FIG. 2 is a simplified circuit diagram showing an alternative embodiment of the circuit of FIG. 1;

FIG. 3 is a simplified circuit diagram of a channel multiplexer in accordance with the present invention; and FIG. 4 is a schematic circuit diagram showing two channels of a multiplexer in accordance with a preferred embodiment of the present invention.

DETAILED DESCRIPTION

Referring initially to FIG. 1, a switching circuit 10 made according to the present invention is shown. Circuit 10 provides switching between an input circuit 11, represented by voltage source 12 and series resistor 13 and an output load 14.

Switching circuit 10 includes a pair of series connected electric field controlled switches 15, 16, preferably field effect transistors (FET'S). The junction 8 between the two switches is connected to a ground or virtual ground through a passive lossy shunt element 17. Element 17 preferably includes a resistor 18. Resistor 18 may also be connected in parallel with a capacitor 19, or in series with an inductor 20. Alternatively, the parallel combination of resistor 18 and capacitor 19 may be connected in series with inductor 20, as shown by dashed lines in FIG. 1.

Element 17 is a lossy element. Thus, the reactive portion of the impedance of element 17 is less significant than the resistive portion over the applicable frequency range. The impedance value of the lossy element is preferably selected to have approximately a 10 to 1 ratio to the impedance measured at the junction 8 in the on state throughout the operating bandwidth.

The operation of FET's 15, 16 is controlled by control circuits 21, 22, respectively, which will be described in further detail with reference to FIG. 4.

Referring now to FIG. 2, a switching circuit 23 is shown which may be utilized to replace switching circuit 10 in the circuit of FIG. 1. Switching circuit 23 includes three series connected FET's 24, 25, 26 with shunt elements 27, 28 (like element 17 in FIG. 1) connected to the junctions 8 and 9 between FET's 24, 25 and 25, 26, respectively. In fact, this ladder-like network can be extended with additional switches and lossy shunt elements, so long as a shunt element exists between each pair of adjacent series connected switches. Each additional switch and shunt element further improve the isolation in off state allowing operation at higher frequencies.

FIG. 3 illustrates another embodiment of the invention in which the switching circuit of FIG. 1 (or 2) is used in a multichannel switching circuit 29. Circuit 29 provides switching between a plurality of input channels, identified as voltage sources, 32, 34 which are connected to separate, but identical, channel switching circuits 10 through corresponding series resistances 36, 38, respectively. The channels, of which only two are shown, are selectively connected to output load 14. During normal operation the two switches associated with a single channel are closed, that is in on state, while the remaining switches of the other channels are open, that is in off state so that only a single channel is connected to load 14 at a time. Preferably, all virtual grounds, such as the ones to which the shunt elements are connected, are interconnected, as represented by lead 40, to eliminate DC offset between the channel switches.

Referring now to FIG. 4 a multichannel switching circuit 30 is connected between a plurality of input terminals, including terminals 42, 44 and an output terminal 46. It will be appreciated that in the circuit of FIG. 4 the switching circuits associated with the input terminals are identical. Therefore, only the channel associated with input terminal 42 will be described, with the understanding that the description associated with that channel will also apply to the other channels.

Input terminal 42 is connected through an input circuit, such as a buffer amplifier 50, to an AC coupling capacitor 52. This capacitor is connected to switching circuit 10 through a series input resistor 54. The junction between capacitor 52 and resistor 54 is connected to virtual ground through a high impedance shunt resistor 56. The input side of capacitor 52 is also connected to a negative voltage through a resistor 55. Resistor 54 is connected to the source of an FET 58 having, preferably, a low Rds(on) for example 15 to 20 ohms. FET 58 is connected to a junction 48 connecting each of the channels through another series FET 60. FET's 58 and 60 have preferably similar characteristics. The junction 8 between the FET's 58 and 60 is connected to virtual ground through a shunt resistor 62 (the simplest form of shunt element 17).

The resistor 62 has a high impedance relative to Rds(on) but a low impedance when compared to the drain to source impedance in off mode. The gate of FET 58 is connected to switch control circuit 21 including a control voltage source V1 at a terminal 64 and a P-I-N diode 66. The cathode of diode 66 is connected to ground through a bypass capacitor 70. As it is well known, the P-I-N diode 66 produces a very high resistance with zero or reverse bias. When forward bias is applied, the P-I-N diode exhibits a low resistance. The P-I-N diode has a lower resistance at high frequencies than a conventional diode. The junction between the gate of FET 58 and the anode of diode 66 is connected to a reference voltage source Vref at terminal 6 through a resistor 68.

When the control voltage $V_1$ at 64 is high, the diode 66 is reverse biased and therefore it has a very high impedance. Consequently, the reference voltage $V_{ref}$ is applied via resistor 68 to the gate of FET 58, thereby turning the FET 58 on. When the control voltage $V_1$ is low, the diode 66 is forward biased and has a low impedance. It applies the low voltage $V_1$ to the gate of FET 58, thereby turning it off. As previously described, in the off mode the undesirable feedthrough signal is bypassed by the diode 66 and capacitor 70 to ground.

FET 60 is controlled by a control circuit 22 similar to that for FET 58, which includes a gate resistor 72 connected to reference voltage $V_{ref}$ at terminal 7 and a P-I-N diode 74. Preferably the reference voltage $V_{ref}$ is applied from a common reference voltage source (not shown) to all FET's in the circuit. In the preferred embodiment the reference voltage $V_{ref}$ is at ground potential. It is understood that when $V_{ref}$ is at ground potential, the control voltages $V_1$, $V_2$ will have a negative value to obtain an off state of the FET's 58, 60.

Junction 48 is preferably connected to virtual ground through a high impedance resistor 76. This resistor maintains the DC value on capacitor 78 when all the channels are off. Consequently, resistor 76 is not required if during operation all the channels are not off at the same time. Junction 48 is also connected to output terminal 46 through an AC coupling capacitor 78 in series with a common-base transistor 80 forming part of an output amplifier, not otherwise shown. The collector of transistor 80 is connected to output terminal 46, and the emitter is connected to capacitor 78, as shown. This circuit provides current summing between the different channels.

AC coupling capacitors 52, 78 and shunt resistors 56, 62, and 76 ensure that all signal lines remain at a common virtual ground potential, thereby preventing any switching offset. As mentioned previously, all virtual grounds are preferably interconnected between the channels. Further, it can be seen that the switching of all FET's within each channel 10 is controlled by a single control voltage source Vl, V2, respectively. It is thus only necessary to coordinate these control voltage sources between channels, and not within channels.

The first order FET parasitic impedances associated with switching circuits 10 include relatively high (approximately 10 pF) parasitic capacitances between the gate and each of the source (Csg) and drain (Cdg) and a relatively low (approximately 0.2 pF) parasitic capacitance between the source and drain (Csd). Thus, when the FET is in the off mode, at relatively high frequencies, there is a relatively low impedance path from the source to the drain via the gate.

At high signal frequencies the gate is connected via a very low impedance path to AC ground, that is through diode 66 and capacitor 70 for bypassing the feedthrough signal in the off state. The shunt element 62 between each pair of series-connected FET's forms a voltage divider to reduce the feedthrough. Thus, the channel remains, when in an off mode, substantially isolated from output junction 48 through the use of the two FET's, and through the use of low impedance gate control circuits which bypass feedthrough currents caused by the relatively low parasitic impedances of the FET's. Further, as has been mentioned, the P-I-N diode is forward biased in the off mode and functions similar to a normal diode at low frequencies. At high frequencies it provides a significantly lower resistance due to intrinsic layer effects, to further decrease the impedance between the gate and AC ground.

The parasitic impedances existing in the FET in an on mode are similar to those described with reference to the off mode except that the capacitances between the gate and source are higher and there is a low resistive impedance between the source and drain, previously described as Rsd(on). Thus, at high frequencies, there can be a substantial bypass to the gate. Such bypassing is substantially eliminated by the gate control circuit which has a high impedance to ground when the FET is in the on mode as previously described. It follows from the above description that the present invention provides a particular advantage at high frequencies since there is less parasitic shunt impedance associated with shunt resistor 62 as there would be if it was an active element.

Further, though all shunt networks are shown connected to ground, it will be appreciated that the ground connections can be replaced with a low impedance interconnection bus or virtual ground which is AC grounded. It will further be seen that the present invention makes it possible to use FET's which have lower Rsd(on) values and higher parasitic capacitances. The series loss resulting from the plurality of series elements is thus less than with FET's designed to have low parasitic capacitance.

Although the FET's described are N-channel junction FET's, it will also be appreciated that MOS devices or other active devices with similar properties may also be used.

When switching circuit 10 is used in a multi-pole switch or multiplexer, such as multiplexing circuit 30, a means of summing the channels is provided. In the preferred embodiment, the channels are tied together and fed into a current summation junction in the output amplifier. This type of connection greatly reduces the interaction between channels and also reduces the bandwidth reduction which would result in the conducting channel from the large capacitance between the drain and gate of the channels in off mode. The series resistances, such as resistor 54, which are used to establish and stabilize the voltage-to-current conversion gain, are located between the input and the first series FET.

As has been described, the switching apparatus of the present invention does not introduce significant DC offset. However, it is likely that the input signals will contain such offsets. This is the case when signals arrive at the switch via coaxial cables which are terminated and buffered by emitter followers. These offsets can cause problems in an AC coupled system following switched transitions as the differential offset appears as a pulse of long duration added to the AC signal. The preferred embodiment of the present invention prevents this problem by providing AC coupling at the inputs and output. The shunt resistors maintain the offset correction in the input coupling capacitors when the channels are in the off mode.

It will be understood that while certain features of the present invention have been described with reference to the multichannel circuit of FIG. 4, such as utilizing a P-I-N diode in the switching control circuits 21, 22 or AC coupling at the input and output terminals, these features may be utilized with the above described single channel embodiments as well.

It will be appreciated that, while a preferred embodiment of the invention has been described herein, variations and modifications may be made without departing from the spirit and scope of the invention as defined in the claims.

I claim:

1. A switching circuit comprising:
    at least two electric field controled switch elements coupled in series between an input and an output terminal;
    a passive, lossy shunt element coupled between a junction of said series coupled switch elements and a virtual ground, said shunt element providing a substantially resistive path for a signal received at said input terminal during a non-conducting state of said switches; and
    control means coupled to each series coupled switch element for selectively applying a control voltage for controlling said switch element.

2. The circuit of claim 1 wherein each said electric field controlled switch element comprises a field effect transistor.

3. The circuit of claim 1 wherein said shunt element comprises a resistor.

4. The circuit of claim 1 wherein said shunt element comprises a parallel combination of a resistor and a capacitor.

5. The circuit of claim 1 wherein said shunt element comprises a series combination of a resistor and an inductor.

6. The circuit of claim 1 wherein said shunt element comprises a parallel combination of a resistor and a capacitor in series with an inductor.

7. The circuit of claim 1 wherein said control means comprises a resistor having a first terminal coupled to a reference voltage, and a second terminal coupled to a control input of said switch element, a diode means coupled to apply said control voltage to said control terminal, said diode means being in one state when said control voltage is lower than said reference voltage and in a second state when said control voltage is higher than said reference voltage.

8. The circuit of claim 7 wherein said switch elements are field effect transistors and each said diode means is a P-I-N diode coupled to apply said control voltage to a gate of said transistor.

9. The circuit of claim 8 wherein said diode has an anode coupled to a junction of said resistor and said gate and a cathode coupled to a control voltage source.

10. The circuit of claim 1 wherein said output terminal is coupled to a current amplifier having a low input impedance.

11. The circuit of claim 1 further comprising a first alternating-current coupling element coupled between said input terminal and an input of a first series switch element and a first resistor coupled between said input of said first switch element and said virtual ground.

12. The circuit of claim 1 further comprising a second alternating-current coupling element coupled between said output terminal and an output of a last series switch element and a second resistor coupled between said output of said last switch element and said virtual ground.

13. The circuit of claim 1 further comprising a series resistor coupled between said input terminal and the input of a first series switch element.

14. The circuit of claim 1 comprising at least two parallel channels, each channel having a separate input terminal and at least two said switch elements coupled in series between said input terminal and said output terminal, said circuit further comprising an output signal summing element coupled to a junction of said output terminals of all said channels.

15. The circuit of claim 14 wherein said output signal summing element is a current summing element.

16. The circuit of claim 14 wherein each channel further comprises a first alternating current coupling element coupled between said input terminal and an input of a first series switch element and a first resistor coupled between said input of said first switch element and said virtual ground.

17. The circuit of claim 16 wherein said virtual ground of all said channels is interconnected.

18. The circuit of claim 17 further comprising a second alternating current coupling element coupled between said junction of output terminals and an input of said output signal summing element and a second resistor coupled between said junction of output terminals and said virtual ground.

19. A switching circuit comprising:
at least two field effect transistors coupled in series between an input and an output terminal;
resistor coupled between a junction of said transistor and a virtual ground; and
control means coupled to each series coupled transistor for selectively applying a control voltage for controlling said transistor.

20. The circuit of claim 19 which further includes a capacitor connected in parallel with said resistor.

21. The circuit of claim 20 which further includes an inductor connected in series with the parallel combination of said resistor and capacitor.

22. The circuit of claim 19 which further includes in inductor in a series combination with said resistor.

23. A switching circuit comprising:
at least two electric field controlled switch elements coupled in series between an input and an output terminal;
a passive, lossy shunt element coupled between a junction of said series coupled switch elements and a virtual ground, said shunt element providing a substantially resistive path for a signal received at said input terminal during a non-conducting state of said switches; and
control means for selectively applying a control voltage for controlling each said switch element, comprising a resistor having a first terminal coupled to a reference voltage, and a second terminal coupled to a control input of said switch element, a diode couple to apply said control voltage to said control terminal, said diode being in one state when said control voltage is lower than said reference voltage and in a second state when said control voltage is higher than said reference voltage.

24. The circuit of claim 23 wherein said switch elements are field effect transistors and each said diode is a P-I-N diode coupled to apply said control voltage to a gate of said transistor.

25. The circuit of claim 23 wherein said output terminal is coupled to a current amplifier having a low input impedance.

26. The circuit of claim 23 further comprising a series resistor coupled between said input terminal and the input of a first series switch element.

27. A switching circuit comprising:
at least two parallel channels, each channel having a separate input terminal and at least two field effect transistor elements coupled in series between one said input terminal and an output terminal;
a passive, lossy shunt element coupled between a junction of each said series coupled switch elements and a virtual ground;
control means for selectively applying a control voltage for controlling each said switch element, comprising a gate resistor having a first terminal coupled to a reference voltage, and a second terminal coupled to a gate of said transistor, a P-I-N diode coupled to apply said control voltage to the gate of said transistor, said diode being in one state when said control voltage is lower than said reference voltage and in a second state when said control voltage is higher than said reference voltage; and
an output signal summing element coupled to said output terminal of all of said channels.

28. The circuit of claim 27 wherein said diode has an anode coupled to a junction of said gate resistor and said gate and a cathode coupled to a control voltage source.

29. The circuit of claim 27 wherein said output signal summing element is a current summing element.

30. The circuit of claim 27 further comprising a first alternating current coupling element coupled between said input terminal and an input of a first series transistor and a first resistor coupled between said input of said first series transistor and said virtual ground.

31. The circuit of claim 30 further comprising a second alternating current coupling element coupled between said output terminal and an output of a last series transistor and a second resistor coupled between said output of said last transistor and said virtual ground.

32. The circuit of claim 31 further comprising a series resistor coupled between said input terminal and the input of said first series transistor.

* * * * *

UNITED STATES PATENT AND TRADEMARK OFFICE
CERTIFICATE OF CORRECTION

PATENT NO. : 4,719,374

DATED : January 12, 1988

INVENTOR(S) : Charles A. Bialo

It is certified that error appears in the above-identified patent and that said Letters Patent is hereby corrected as shown below:

In the abstract, line 5, "around" should read --ground--.

Signed and Sealed this

Sixteenth Day of August, 1988

Attest:

DONALD J. QUIGG

*Attesting Officer*  *Commissioner of Patents and Trademarks*